(12) United States Patent
Kato et al.

(10) Patent No.: US 7,709,383 B2
(45) Date of Patent: May 4, 2010

(54) FILM FORMING METHOD, AND SUBSTRATE-PROCESSING APPARATUS

(75) Inventors: Hirokazu Kato, Yokohama (JP); Tomoyuki Takeishi, Kawasaki (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1142 days.

(21) Appl. No.: 11/034,926

(22) Filed: Jan. 14, 2005

(65) Prior Publication Data

US 2005/0208777 A1    Sep. 22, 2005

(30) Foreign Application Priority Data

Jan. 15, 2004    (JP)    ............................. 2004-008306

(51) Int. Cl.
*H01L 21/20* (2006.01)
*H01L 21/44* (2006.01)

(52) U.S. Cl. ........................ 438/679; 438/496; 438/584; 438/680; 438/681; 438/781

(58) Field of Classification Search ........................ None
See application file for complete search history.

(56) References Cited

U.S. PATENT DOCUMENTS 4,468,411 A * 8/1984 Sloan et al. .................... 438/15

(Continued)

FOREIGN PATENT DOCUMENTS

JP    64-22375    *    1/1989

(Continued)

OTHER PUBLICATIONS

Acreo, Part of Swedish ICT, 2004<http://www.acreo.se/templates/Page_536.aspx>.*

(Continued)

*Primary Examiner*—Matthew C Landau
*Assistant Examiner*—James M Mitchell
(74) *Attorney, Agent, or Firm*—Finnegan, Henderson, Farabow, Garrett & Dunner, L.L.P.

(57) ABSTRACT

A film forming method comprising forming a liquid coating film on a substrate by supplying a liquid containing a coating type thin film forming substance and a solvent onto the substrate, substantially converging a variation in film thickness of the coating film, making the coating film stand by in an atmosphere including moisture under a predetermined condition after the substantial-convergence, the predetermined condition being such that a product of a time for which the coating film is exposed to the atmosphere and a water content per unit volume in an atmosphere in the vicinity of a surface of the coating film is made to be greater than or equal to a predetermined value, and forming a solid thin film on the substrate after the stand-by, the thin film being formed by carrying out an elimination of the solvent in the coating film and heat treatment for generating an irreversible reaction to the coating type thin film forming substance in the coating film.

20 Claims, 5 Drawing Sheets

U.S. PATENT DOCUMENTS

| | | | |
|---|---|---|---|
| 5,449,405 A * | 9/1995 | Cardinali et al. | 118/50 |
| 6,319,853 B1 * | 11/2001 | Ishibashi et al. | 438/780 |
| 6,437,441 B1 * | 8/2002 | Yamamoto | 257/758 |
| 6,680,541 B2 * | 1/2004 | Furusawa et al. | 257/759 |
| 2004/0077122 A1 * | 4/2004 | Wu et al. | 438/99 |
| 2004/0121617 A1 * | 6/2004 | Kawano et al. | 438/781 |
| 2005/0003681 A1 * | 1/2005 | Lyu et al. | 438/781 |

FOREIGN PATENT DOCUMENTS

| | | |
|---|---|---|
| JP | 06-084787 | 3/1994 |
| JP | 08-055858 | 2/1996 |
| JP | 08-076385 | 3/1996 |
| JP | 2000-012427 | 1/2000 |
| JP | 3118887 | 10/2000 |
| JP | 2001-26415 | 1/2001 |
| JP | 2001-102376 | 4/2001 |
| JP | 2002-118102 | 4/2002 |

OTHER PUBLICATIONS

Notification for Filing Opinion mailed Mar. 29, 2006, issued by the Korean Intellectual Property Office in counterpart Korean Application No. 10-2005-3597 and English translation thereof.

Partial English-language Translation of JP 5-66571, filed Sep. 9, 1991.

Partial English-language Translation of JP 63-117422, filed May 21, 1988.

Partial English-language Translation of JP 4-142033, filed May 15, 1992.

Communication from Japanese Patent Office, Notification of Reasons for Rejection, in co-pending Japanese Patent Application No. 2004-008306, mailed Sep. 2, 2008 with English language translation (7 pages).

\* cited by examiner

FIG. 1A
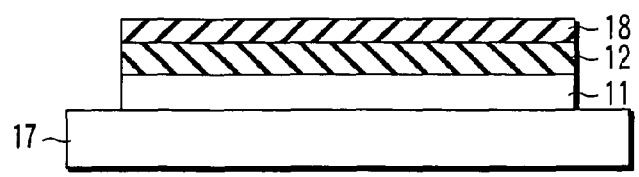
FIG. 1E
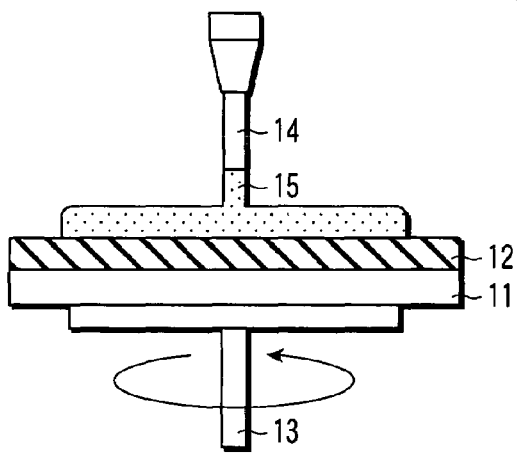
FIG. 1B
FIG. 1C
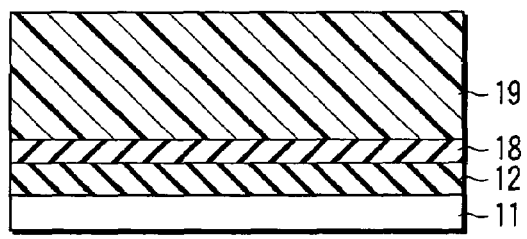
FIG. 1F
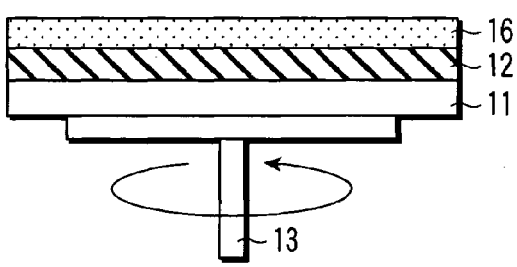
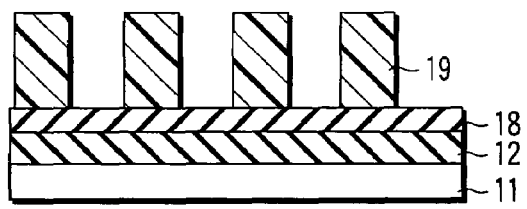
FIG. 1G
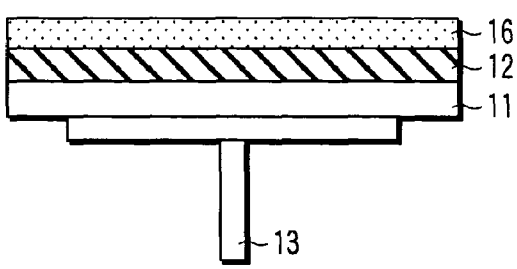
FIG. 1D
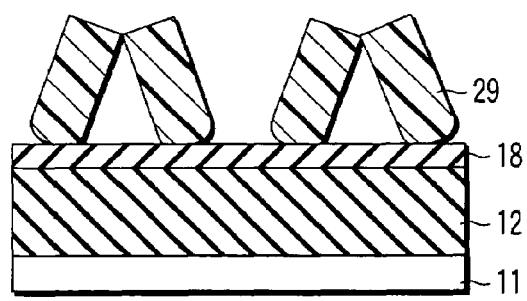
FIG. 2

F I G. 7A
F I G. 7B
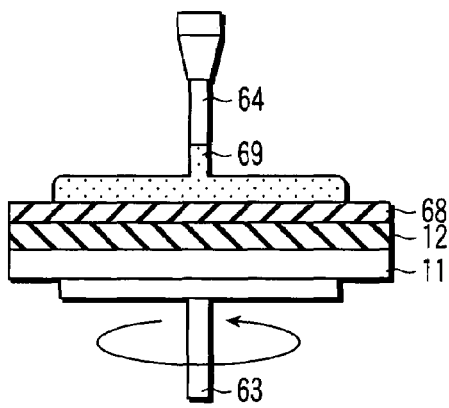
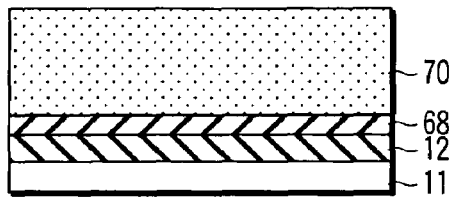
F I G. 7C
F I G. 7D
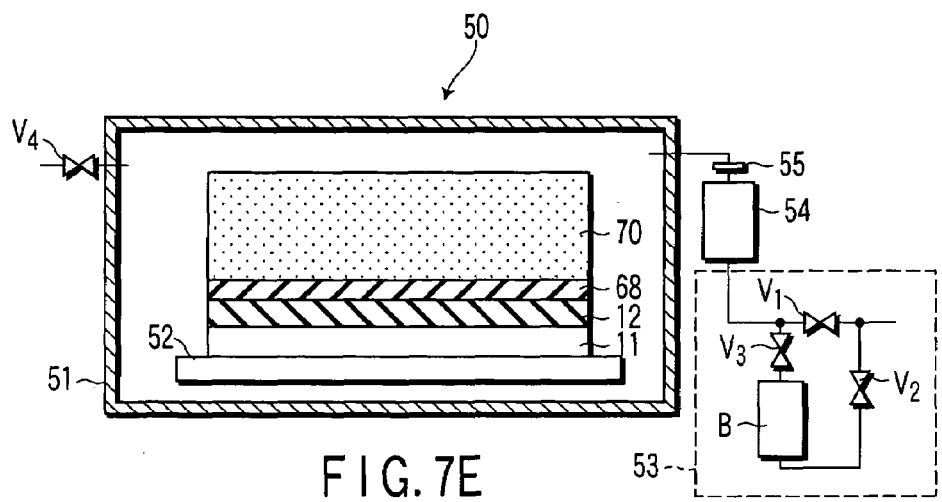
F I G. 7E
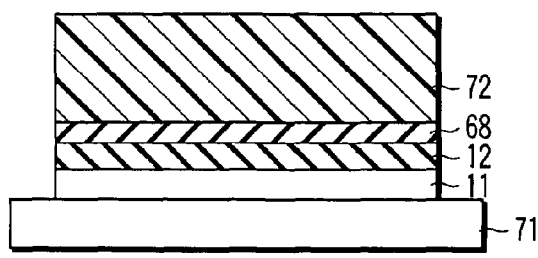
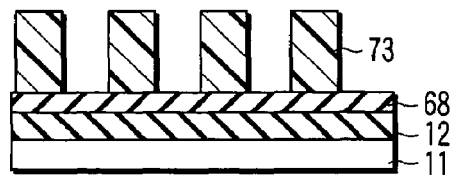
F I G. 7F
F I G. 7G

US 7,709,383 B2

FILM FORMING METHOD, AND SUBSTRATE-PROCESSING APPARATUS

CROSS-REFERENCE TO RELATED APPLICATIONS

This application is based upon and claims the benefit of priority from prior Japanese Patent Application No. 2004-8306, filed Jan. 15, 2004, the entire contents of which are incorporated herein by reference.

BACKGROUND OF THE INVENTION

1. Field of the Invention

The present invention relates to a film forming method for forming, for example, a coating-type thin film on a surface of a semiconductor substrate or a liquid crystal display (LCD) substrate, and to a film-forming apparatus for use in the film forming method.

2. Description of the Related Art

In recent years, the demand for the high-integration of an LSI has been increased still more, and accompanying the demand, an extremely high accurate processing technology in which such that a fine device pattern of 100 nm or less is formed has been required for a semiconductor lithography technology. Therefore, with respect to a pattern exposure apparatus, it has progressed in making the high-resolution apparatus by making a wavelength of an excimer laser used for exposure into a shorter wavelength, such as KrF→ArF→$F_2$. On the other hand, as the miniaturization is made to progress, the pattern collapse of a resist film can be no longer ignored. Accordingly, a multilayer resist process for preventing the pattern collapse by decreasing a film thickness of a chemically amplified resist has been used.

However, decrease in film thickness of various films of a resist or the like has been made to progress, and on the other hand, the film-forming technology for always stably forming a thin film having a desired film quality has been going to be difficult. For example, in the multilayer resist process described above as well, it has been the problem that the resist pattern formed on a top layer of an SOG film collapses (peels off) even when just a little variation in the resist process arises between lots. On the other hand, in Jpn. Pat. Appln. KOKAI Publication No. 6-84787, there has been reported that a chemically amplified resist is formed after once applying hydrophobic processing onto the surface of an SOG film, whereby a resist pattern is suppressed from being peeled off. However, this method has had a given effect on suppression of the peeling-off of the resist pattern, which has not resulted in sufficient reforming the film quality of the formed SOG film.

BRIEF SUMMARY OF THE INVENTION

According to an aspect of the present invention, there is provided a film forming method comprising forming a liquid coating film on a substrate by supplying a liquid containing a coating type thin film forming substance and a solvent onto the substrate, substantially converging a variation in film thickness of the coating film, making the coating film stand by in an atmosphere including moisture under a predetermined condition after the substantial-convergence, the predetermined condition being such that a product of a time for which the coating film is exposed to the atmosphere and a water content per unit volume in an atmosphere in the vicinity of a surface of the coating film is made to be greater than or equal to a predetermined value, and forming a solid thin film on the substrate after the stand-by, the thin film being formed by carrying out an elimination of the solvent in the coating film and heat treatment for generating an irreversible reaction to the coating type thin film forming substance in the coating film, and reforming a surface layer of the coating film into a miniature structure by the stand-by and the heat treatment, the surface layer being reformed by hydrolyzing the molecules of the surface layer and making the molecular content of the surface layer molecules less.

BRIEF DESCRIPTION OF THE SEVERAL VIEWS OF THE DRAWING

FIGS. 1A to 1G are cross-sectional views showing a pattern forming method according to a first embodiment;

FIG. 2 is a cross-sectional view schematically showing peeling-off of the pattern when a pattern is formed in a conventional three-layer resist process;

FIGS. 7A to 7G are diagrams showing the procedure of a pattern forming method according to a fifth embodiment.

DETAILED DESCRIPTION OF THE INVENTION

Figure 3:
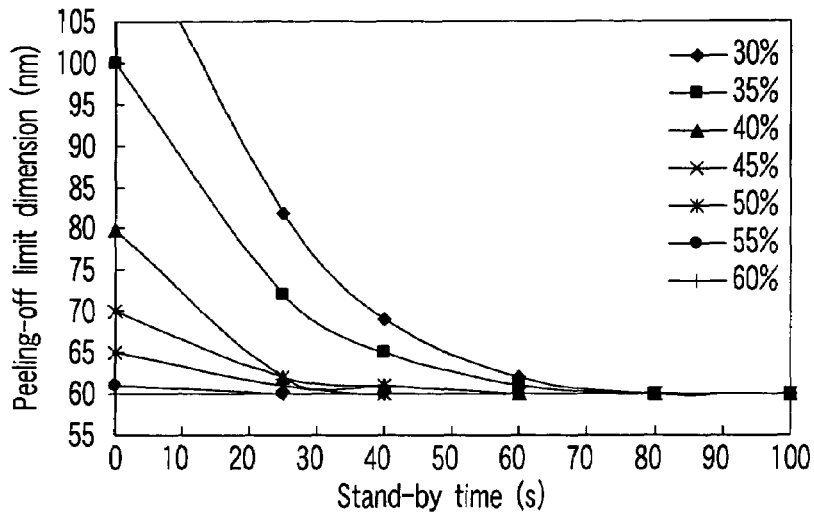
FIG. 3 is a graph in which limit dimensions of peeling-off with respect to processing times are plotted for respective humidities.

Hereinafter, embodiments of the present invention will be described with reference to the drawings.

First Embodiment

In the present embodiment, there is described a case where a resist pattern is formed upon an SOG film which is an intermediate film in the three-layer resist process by using a film-forming method according to a first embodiment of the present invention.

FIGS. 1A to 1G are cross-sectional views showing a pattern forming method according to the first embodiment of the invention.

First, as shown in FIG. 1A, an antireflection film coating material is coated onto a substrate 11 including a semiconductor wafer by a spin coating method. By heating the substrate 11 under the condition of 300° C. for 120 seconds, an antireflection film 12 whose film thickness is 300 nm is formed on the substrate 11. Further, for example, Spun on C which is formed from carbon is used as the antireflection film 12. Note that the substrate 11 is a wafer in the middle of manufacturing the semiconductor device.

As shown in FIG. 1B, the substrate 11 is held by a spin chuck 13. Then, the substrate 11 is rotated along with the spin chuck 13. An SOG film solution 15 is discharged upon the antireflection film 12 on the rotating substrate 11 from a processing liquid supplying nozzle 14 held by a movable arm (not shown). Then, as shown in FIG. 1C, by rotation of the substrate 11, an SOG solution film 16 is formed on the entire surface on the substrate 11. After a stop of discharging the SOG film solution 15, the film thickness of the SOG solution film 16 is greatly reduced during the initial stage. Subsequently, as a solvent volatilizes, a variation in the film thickness of the SOG solution film 16 is attenuated. In a short time, the film thickness of the SOG solution film 16 comes to hardly vary. Usually, in order to maximize the processing efficiency, the substrate 11 is conveyed to a heat treatment section immediately after a variation in the film thickness of the SOG solution film 16 is settled. In the present embodiment, after the variation in the film thickness of the SOG solution film 16 is substantially settled, the rotation of the spin chuck 13 is made to stop. After stopping the rotation, the substrate 11 is made to stand by under the condition of 25° C. for 25 seconds (FIG. 1D). Note that the humidity in the vicinity of the substrate 11 on stand-by was 40%.

Here, in order to suppress pattern peeling-off which is brought about at the interface between a resist film to be formed later and the SOG film, a water content to which the SOG solution film 16 reacts during the stand-by time is important. A water content per unit volume which exists in the vicinity of the substrate 11 can be determined by the following formula (1).

$$\text{Water content(mg/L)} = \text{saturated water vapor content at processing temperature(mg/L)} \times \text{humidity(\%)} \quad (1)$$

In the case of the embodiment, the processing temperature is 25° C. The saturated water vapor content at 25° C. is 23.04 (mg/L). Therefore, the water content in the vicinity of the surface of the substrate 11 is 23.04×0.4=9.22 (mg/L) from the formula (1).

Then, the water content reacting to the SOG film can be expressed by the product of the water content expressed by the formula (1) and the processing time. Accordingly, the water content reacting to the SOG film can be made to be:

$$9.22(\text{mg/L}) \times 25(\text{s}) = 230.4(\text{s} \times \text{mg/L}) \quad (2).$$

After completion of the processing at the coating processing section, as shown in FIG. 1E, the substrate 11 is conveyed to the heat treatment section. The substrate 11 is heated under the condition of 350° C. for 120 seconds on a hot plate 17, whereby an SOG film 18 whose film thickness is 50 nm is formed on the substrate 11.

Thereafter, as shown in FIG. 1F, a chemically amplified positive resist for an ArF light (whose wavelength is 193 nm) is coated upon the SOG film 18 by a spin coating method. By heating the substrate 11 under the condition of 120° C. for 60 seconds, a resist film 19 whose film thickness is 200 nm is formed on the SOG film 18.

Next, a pattern formed on a reticle for exposure is transferred upon the resist film 19 by a reducing projection exposure by using an ArF excimer laser. The substrate 11 is heated under the condition of 130° C. for 60 seconds. After the heat treatment, the substrate 11 is conveyed to a developing apparatus. In the developing apparatus, a developer is supplied onto the substrate 11. After developing for 30 seconds, a pure water is supplied onto the substrate 11 while rotating the substrate 11, and thereby a stop of the reaction and cleaning are carried out. The substrate 11 is dried by spin drying. By carrying out these processings, as shown in FIG. 1G, a 1:1 line-and-space pattern 19 with the half pitch of 90 nm is formed on the substrate.

The inventors prepared a plurality of line-and-space patterns whose exposure amounts during the time of reducing projection exposure are different from one another. When an exposure amount increases, a line dimension of the line-and-space pattern 19 is made narrow. The inventors observed respectively the cross-sections of the plurality of line-and-space patterns 19 whose exposure amounts are different from one another with a scanning electron microscope (SEM). Even when an exposure amount was increased until the line dimension of the line-and-space pattern 19 was made to be 60 nm, the resist pattern 19 did not peel off at the interface between the resist pattern 19 and the SOG film 18, and a vertical resist pattern was formed. Note that a limit dimension for pattern collapse when the substrate 11 is not made to stand by for a predetermined time was 80 nm.

On the other hand, heat treatment was carried out immediately after coating the SOG film, and moreover, the plurality of line-and-space patterns whose exposure amounts during the time of reducing projection exposure are different from one another were prepared. The inventors observed respectively the cross-sections of the plurality of line-and-space patterns 19 whose exposure amounts are different from one another with the scanning electron microscope (SEM). When the substrate 11 is not made to stand by, on patterns in which the line dimension of a 1:1 line-and-space pattern is less than or equal to 95 nm, as shown in FIG. 2, the lower ends of resist patterns 29 were made narrow, and most of the resist patterns 29 peel off at the interface between the resist patterns 29 and the SOG film.

As described above, it could be verified that, the semiconductor device manufactured by being processed with a resist pattern prepared by using the method described in the present embodiment being as a mask could process a pattern finer than that of the semiconductor device manufactured without carrying out the processing can be processed, and the yield thereof was improved.

In the present embodiment, the substrate was further made to stand by for 25 seconds in the atmosphere whose humidity is 40% after the variation in the film thickness of the SOG coating film was substantially settled, but, the embodiment is not limited to this condition. As a result of proceeding with thorough examination, the inventors found out an optimum condition under which pattern peeling-off at the interface between the resist film and the SOG film was suppressed at the maximum. The optimum condition is to make a water content reacting to the SOG film which can be determined by the product of a stand-by time from the time when the variation in the film thickness in the process of forming the SOG solution film is substantially settled up to the time when the process of performing heat treatment to the SOG solution film is irreversibly started, and a water content in the vicinity of the substrate during the stand-by time {the formula (1) and the formula (2)}, to be greater than or equal to 200 s×mg/L.

In this embodiment, in the case where the humidity is 40%, regardless of the humidity in the vicinity of the substrate during the stand-by time, the water content reacting to the SOG solution film can be sufficiently insured by setting the stand-by time to 25 seconds or more. As a result, the resist pattern collapse caused by the peeling-off at the interface between the resist film and the SOG film is not brought about, and the performance of the SOG film can be brought out to a maximum. It goes without saying that the processing condition is not limited to the condition that the humidity is 40% and the stand-by time is 25 seconds. The processing condition may be any condition provided that the humidity and the stand-by time can satisfy the condition that the water content reacting to the SOG film is 200 s×mg/L or more. FIG. 3 is a graph in which limit dimensions for peeling-off with respect to processing times are plotted with respect to respective humidities. The higher the humidity is, the shorter the processing time is in which the performance of the SOG film is brought out to a maximum. Further, when the maximum performance is not required, a processing condition may be appropriately selected in accordance with a relationship between a water content reacting to the SOG film and a limit dimension for collapse. Due to the above-described relationships being satisfied, with respect to a pattern whose aspect ratio is 2 to 3, a resist pattern can be formed without peeling-off at the interface between the resist film and the SOG film.

Figure 4:
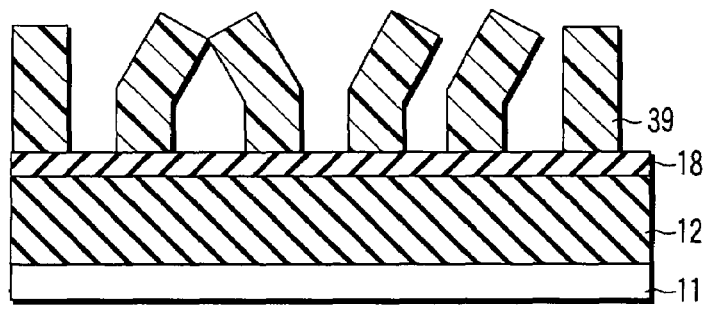
FIG. 4 is a diagram schematically showing a resist pattern bending phenomenon brought about due to a shortage of resist strength.

Further, a pattern collapse phenomenon brought about in a pattern of 60 nm or less is not pattern peeling-off brought about at the interface between the resist pattern and the SOG film. As shown in FIG. 4, that phenomenon is bending of a resist pattern 39 occurring due to the shortage of the strength of the resist pattern 39. Needless to say, when the maximum performance is not required, the humidity in the film quality control section can be made low, or the processing time can be shortened, appropriately.

The SOG film is formed in such a manner that the residual solvent in the SOG coating film volatilizes at the time of burning the SOG coating film by heat treatment, and that SOG molecules react to crosslink together at the same time. It is said that the formed SOG film has a relatively porous structure from the feature of the molecular structure thereof. On the other hand, the coating solution for forming the SOG film contains an accessory component other than a resin for the purpose of improving the preservative stability of a chemical liquid, or the like, in addition to an SOG resin. When a chemically amplified resist is formed on the SOG film containing the accessory component, and a desired pattern is exposed by reducing projection and developed, the accessory component in the SOG film diffuses into the chemically amplified resist, so that the bottom portion of the resist pattern is dissolved. This brings about resist pattern peeling-off at the interface between the chemically amplified resist pattern and the SOG film as shown in FIG. 2. Then, in the present embodiment, during the interval from the time when the SOG coating film is formed up to the time when heat treatment is carried out, the solvent in the SOG coating film volatilizes to some extent due to the SOG coating film being made to stand by for a predetermined time or more. Thereafter, a minute SOG film is formed by carrying out heat treatment. Moreover, the surface layer of the SOG coating film is made to come into contact with moisture, whereby the SOG molecules are hydrolyzed, and the molecular content of the SOG molecules are made less. This reforms the surface layer of the SOG coating film into a miniature structure. Consequently, the accessory component in the SOG film is prevented from diffusing into the resist pattern, and as a result, pattern peeling-off is suppressed.

In this way, in this embodiment, pattern peeling-off brought about at the interface between the SOG film and the resist film is suppressed by determining a relationship between a water content reacting to the SOG film and a dimension by which pattern collapse of the resist pattern is brought about in advance during the interval from the time when the variation in the film thickness is substantially settled up to the time when a process of irreversibly heat processing the coating film is started. However, a method of obtaining a desired SOG film is not necessarily determined on the basis of only the above-described relationship. Focusing on different parameters, an effect which is substantially the same as that of the method described above can be obtained by controlling the parameters. For example, in addition thereto, the same effect can be obtained by observing the residual solvent content in the SOG coating film before heat treatment after coating an SOG solution, and by controlling the residual solvent content as well. The greater the residual solvent content in the SOG coating film before heat treatment is, the thicker pattern the resist pattern peels off in, and the less the residual solvent content is, the harder the resist pattern is to peel off.

The SOG film is formed in such a manner that the residual solvent in the SOG coating film volatilizes by heat treatment, and that SOG molecules react to crosslink together at the same time. Therefore, when there are a lot of solvent content in the SOG coating film, the SOG film becomes a more porous structure in such a manner that the crosslink reaction is made to progress while the solvent is rapidly being made to volatilize during heat treatment. In contrast thereto, when the residual solvent content in the SOG coating film is little, a miniature SOG film is formed. In this way, by setting the temperature, the humidity, or the like in the vicinity of the substrate during the stand-by time or before heat treatment such that the residual solvent content is made less than or equal to a predetermined value as well, an SOG film quality can be controlled in the same way as the present embodiment.

In addition thereto, the same effect can be obtained by observing states of the surface of the SOG coating film, and by deriving the relationship between the states of the surface and a pattern dimension by which pattern collapse of the resist pattern is brought about. At least one relationship is acquired from among the relationships between the dimension by which pattern collapse of the resist pattern is brought about and a contact angle of a liquid with respect to the SOG coating film, an optical constant of the SOG coating film, the surface roughness of the SOG coating film, and a chemical composition in the depth direction of the SOG coating film, and by forming the SOG coating film on the basis of the acquired relationship as well, a target resist pattern can be formed.

SOG is said from the feature of the molecular structure thereof that the SOG film formed by coating and heat treatment has a low density, and becomes a porous structure. On the other hand, the coating chemical liquid for forming SOG includes an accessory component other than a resin for the purpose of improving the preservative stability of the chemical liquid, or the like, in addition to an SOG resin. When a chemically amplified resist is formed on the SOG including the accessory component, and a desired pattern is exposed by reducing projection and developed, the accessory component in the SOG film diffuses into the chemically amplified resist, so that the bottom portion of the resist pattern is dissolved. Accordingly, resist pattern peeling-off at the interface between the chemically amplified resist and the SOG film as shown in FIG. 2 is brought about.

Further, the same effect can be obtained in such a manner that the surface of the SOG coating film is made to come into contact with moisture by causing a substance including moisture (for example, a hygroscopic substance such as a sponge, a cloth, or a paper) to come into contact with or to approach to the surface of the coating film after forming the coating film. A method for controlling the film quality of the SOG film is not limited thereto, and may be any format by which a sufficient water content for controlling the film quality of the SOG film can be supplied.

In the present embodiment, the case of the SOG film has been described. However, a material for which the pattern forming method described above is available is not limited thereto. To describe concretely, the pattern forming method is available for a material classified into a known SOD film as well.

The chemically amplified resist having the reactivity to an ArF is used as the resist used in the present embodiment. However, it is not limited thereto, the same effect could be obtained with respect to other alicyclic resins (acrylic, cycloolefin methyl adamantine, and hybrid resins) as well. Further, the pattern forming method is effective for a resin having an aromatic compound as well, and the effect upon i-line and g-line resists having a novolak resin, a KrF resist composed of a resin having a polyvinyl phenolic skeleton, an electron beam exposure resist, a soft X-ray (EUV) exposure resist, or the like as well could be verified.

Second Embodiment

In this embodiment, there is described a case where a resist pattern is formed by using a film-forming method according to a second embodiment of the present invention upon an SOG film which is an intermediate film in a three-layer resist process.

Figure 5A:
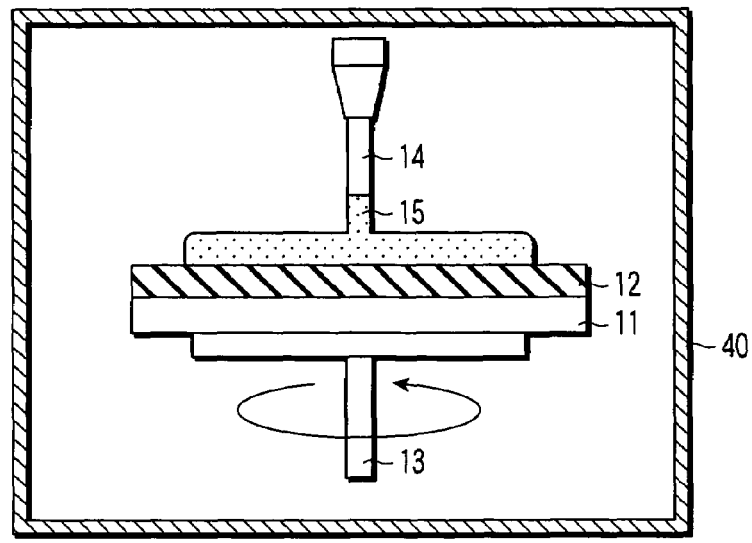
FIGS. 5A and 5B are diagrams showing the procedure of a pattern forming method according to a second embodiment.
Figure 5B:
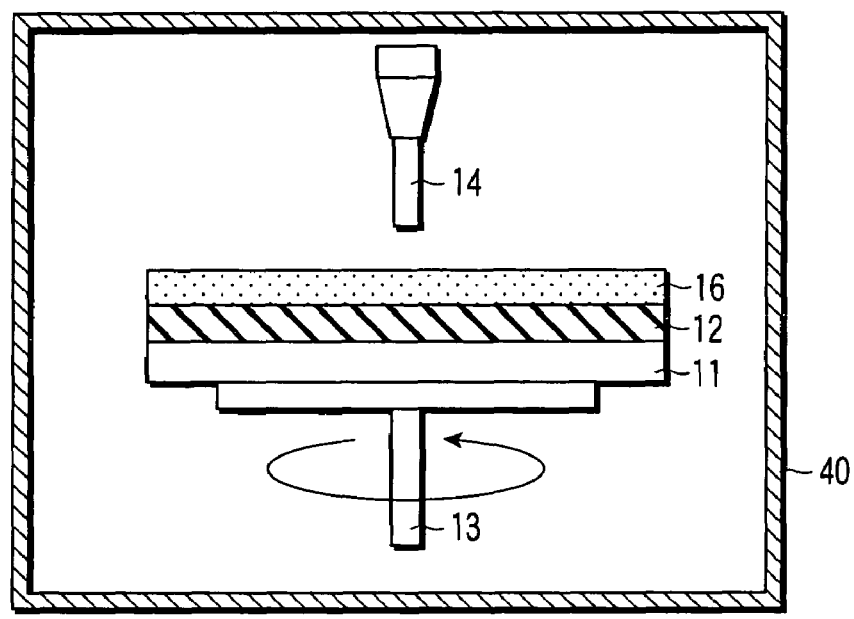

Here, an embodiment in which coating processing and stand-by processing are carried out in a coating processing section in which the temperature and the humidity are controlled will be described. Note that the conditions other than those of the coating processing and the stand-by processing are the same as those in the first embodiment, and therefore, descriptions thereof will be omitted. FIGS. 5A and 5B are diagrams showing the procedure of a pattern forming method according to the second embodiment of the invention.

As shown in FIG. 5A, the substrate 11 is conveyed to a coating processing section 40, and the substrate 11 is held by the spin chuck 13. The inside of the coating processing section 40 is controlled such that the temperature is 40° C., and the humidity in the vicinity of the substrate is 80%. The substrate 11 is then rotated by the rotation of the spin chuck 13, and the SOG film solution 15 is discharged upon the antireflection film 12 from the processing liquid supplying nozzle 14 held by a movable arm (not shown). Then, as shown in FIG. 5B, the SOG solution film 16 is formed on the substrate 11 by the rotation of the substrate 11.

Although the film thickness of the SOG solution film 16 is greatly reduced during the beginning of the rotation, the variation in the film thickness of the SOG solution film 16 is attenuated as the solvent volatilizes, and in a short time, the film thickness comes to hardly vary. At the stage when five seconds or more has elapsed after the variation in the film thickness of the SOG solution film 16 is settled, the substrate is conveyed to the heat treatment section. Here, in the same way as in the first embodiment, the water content reacting to the SOG film becomes 265.6 s×mg/L by the formula (1) and the formula (2), and a water content of 200 s×mg/L or more reacts to the SOG solution film 16.

After the conveyance to the heat treatment section, a resist pattern is formed onto the substrate 11 through processes which are the same as the processings described in the first embodiment.

The inventors prepared a plurality of line-and-space patterns whose exposure amounts during the time of reducing projection exposure are different from one another. When an exposure amount increases, a line dimension of the line-and-space pattern 19 is made narrow. The inventors observed respectively the cross-sections of the plurality of line-and-space patterns 19 whose exposure amounts are different from one another with the scanning electron microscope (SEM). Even when an exposure amount was increased until the line dimension of the line-and-space pattern 19 was made to be 60 nm, the resist pattern 19 did not peel off at the interface between the resist pattern 19 and the SOG film 18, and a vertical resist pattern was formed.

In this embodiment, the coating processing onto the SOG film is carried out under the environment that the temperature is 40° C. and the humidity is 80% in the coating processing section, and the substrate is conveyed to the heat treatment section only after being made to stand by for five seconds in a state in which the variation in the film thickness is substantially settled, and the next process is carried out. In spite thereof, the pattern peeling-off at the interface between the resist pattern and the SOG film could be suppressed at the maximum. This is because the saturated water vapor content in the processing section is made large by setting the temperature inside the coating processing section to 40° C. As a result, the water content reacting to the SOG solution film is made to be 200 s×mg/L or more in a shorter time.

In the embodiment, the chemically amplified resist having the reactivity to an ArF was used. However, it is not limited thereto, and the same effect could be obtained with respect to other alicyclic resins (acrylic, cycloolefin methyl adamantine, and hybrid resins) as well. Further, it is available for a resin having an aromatic compound as well, and the effect upon i-line and g-line resists having a novolak resin, a KrF resist composed of a resin having a polyvinyl phenolic skeleton, an electron beam exposure resist, a soft X-ray (EUV) exposure resist, or the like as well could be verified.

Third Embodiment

In this embodiment, there is described a case where a resist pattern is formed by using a film-forming method according to a third embodiment of the present invention upon an SOG film which is an intermediate film in a three-layer resist process.

In the present embodiment, before heat treatment onto a coating film formed on the substrate is carried out, the coating film plane is exposed to moisture greater than or equal to the circumferential environment. Next, an explanation will be given to a method of forming a resist pattern after a chemically amplified resist film is coated to be formed onto the SOG film in accordance with this processing without the pattern being peeled off from the interface between the resist film and the SOG film when the resist film is exposed and developed.

Here, there is explained an embodiment in which stand-by processing is carried out in the film quality control section in which the temperature and the humidity are controlled. Note that the conditions other than those of the coating processing and the stand-by processing are the same as those in the first embodiment, and therefore, descriptions thereof will be omitted.

Figure 6:
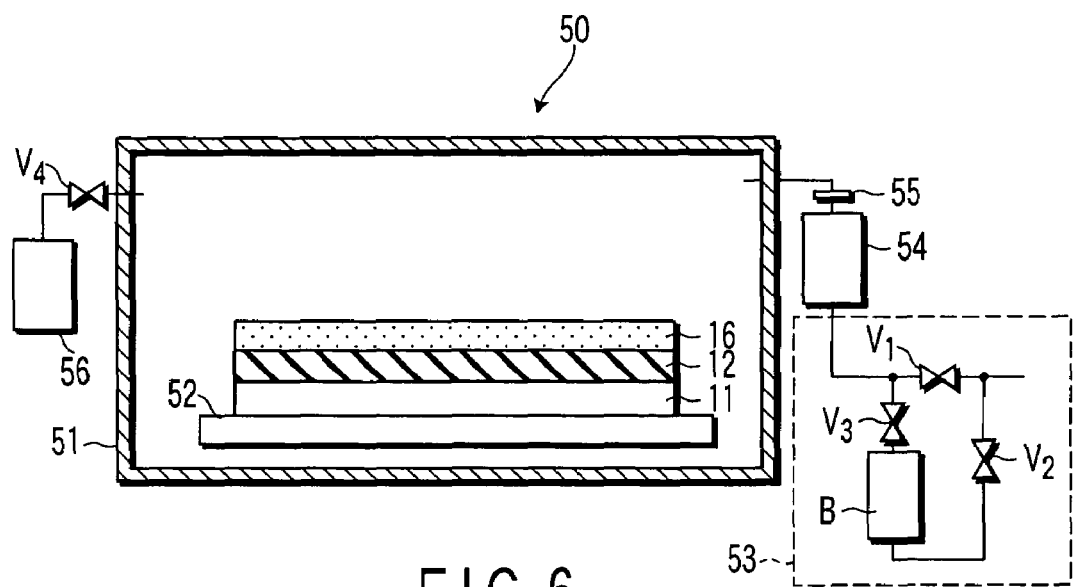
FIG. 6 shows a state in which a substrate 11 is loaded onto a film quality control section 50 according to a third embodiment.

After forming the SOG film, as shown in FIG. 6, the substrate 11 is conveyed to a film quality control section 50. The film quality control section 50 has a processing container 51 for housing the substrate 11; a temperature control plate 52 for controlling the temperature of the substrate; a gas supplying mechanism 53 for supplying gas including moisture into the processing container; a gas temperature control mechanism 54 for controlling the temperature in the processing container; a water content control mechanism 55 for controlling a water content included in the gas supplied from the gas supplying mechanism 53; and a mechanism 56 for discharging the gas in the processing container. The control mechanism has a bubbler B and valves $V_1$ to $V_3$. The gas temperature control mechanism 54 controls the temperature of the gas supplied into the processing container 51. The water content control mechanism 55 measures the gas humidity included in the gas, and determines a water content per unit volume. Then, the openings of the valves $V_1$ to $V_3$ are adjusted such that that water content is made to be greater than or equal to a predetermined value. The pressure in the processing container 51 is controlled by controlling a supplied amount from the gas supplying mechanism 53 and an opening of a valve $V_4$.

The substrate 11 is loaded on the temperature control plate 52. Then, film quality control processing is carried out with respect to the substrate under the condition of 24° C. for 17 seconds under the environment that the temperature is 24° C. and the humidity is 60% in the coating control section. In accordance with this processing, the water content reacting to the SOG film can be determined to be 222.1 s×mg/L by the formula (1) and the formula (2), and the condition of 200 s×mg/L or more can be satisfied.

After the conveyance to the heat treatment section, a resist pattern is formed onto the substrate through processes which are the same as the processings described in the first embodiment. When the cross-sections of the resist pattern formed by the above-described processes were observed with the scanning electron microscope (SEM), even when a light exposure was increased until the line dimension of the 1:1 line-and-space pattern was made to be 60 nm, there was no resist pattern peeling-off at the interface between the resist film and the SOG film, and a vertical pattern was formed.

On the other hand, the cross-sections of the resist pattern formed on the SOG film on which heat treatment has been carried out immediately after coating the SOG film without any film quality control processing were observed with the scanning electron microscope (SEM). In this case, on a pattern in which the dimension of a 1:1 line-and-space pattern is less than or equal to 95 nm, as shown in FIG. 2, there is thinning in the lower end of the resist, and most of the resist patterns are peeled off at the interface between the resist film and the SOG film.

As described above, the semiconductor device manufactured by being processed with a resist pattern prepared by using the method described in the present embodiment as a mask could process a pattern which is finer than that of the semiconductor device manufactured without carrying out the processing, and the yield thereof was improved.

Further, in the embodiment, in order to control the film quality of the SOG film, the film quality control section is independently provided separately from the coating processing section and the heat treatment section, and desired processing is carried out. However, the present embodiment is not limited thereto.

For example, the film quality of the SOG film can be controlled by spraying a gas whose humidity is 60% onto the SOG coating film in a state in which the substrate having the SOG coating film formed thereon is conveyed to the heat treatment section, and the substrate is held at a position sufficiently kept away from the hot plate in the heat treatment section. Further, in this case, the temperature of the substrate rises by receiving heat from the hot plate in the heat treatment section. Therefore, it is recommended that an optimum condition be appropriately used in accordance with a usage based on the relationships between the limit dimension value for collapse and the temperature of the gas to be sprayed, the humidity, the processing time, and the temperature of the substrate.

Further, the same effect can be obtained in such a manner that the surface of the SOG coating film is made to come into contact with moisture by causing a substance including moisture (for example, a hygroscopic substance such as a sponge, a cloth, or a paper) to come into contact with or to approach to the surface of the coating film. A method of controlling the film quality is not limited thereto, and may be any mode by which a sufficient water content for controlling the film quality of the SOG film can be supplied.

Fourth Embodiment

In the first to third embodiments, there has been described the method of suppressing peeling-off of the resist pattern on the SOG film by reforming the SOG film in the film quality control section during the time between coating processing and heat treatment onto the SOG film. In the following embodiment, a method in which the effects which are the same as in the above-described embodiments can be obtained in a shorter time will be described.

Here, there is explained an embodiment in which stand-by processing is carried out in the film quality control section in which the temperature and the humidity are controlled. Note that the conditions other than those of the coating processing and the stand-by processing are the same as those in the first embodiment, and therefore, descriptions thereof will be omitted.

After forming the SOG solution film 16, the substrate 11 is conveyed to a film quality control section 50 shown in FIG. 6, and the substrate 11 is loaded on a temperature control plate 52. Then, a gas (air) whose temperature is 40° C. and whose humidity is 45% is sprayed onto the SOG solution film 16 for five seconds in a state in which the substrate is maintained at 23° C. At that time, moisture in the gas condenses into dew on the SOG solution film 16.

After the conveyance to the heat treatment section, a resist pattern is formed onto the substrate through processes which are the same as the processings described in the first embodiment. When the cross-sections of the resist pattern formed by the above-described processes were observed with the scanning electron microscope (SEM), even when an exposure amount was increased until the line dimension of the 1:1 line-and-space pattern was made to be 60 nm, there was no resist pattern peeling-off at the interface between the resist film and the SOG film, and a vertical pattern was formed.

As described above, the semiconductor device manufactured by being processed with a resist pattern prepared by using a method described in the present embodiment as a mask could process a pattern which is finer than that of the semiconductor device manufactured without carrying out the processing, and the yield thereof is improved.

In the present embodiment, after completion of the coating processing of the SOG solution film 16, a gas whose temperature is 40° C. and whose humidity is 45% is sprayed onto the substrate in a state in which the temperature of the substrate 11 is maintained at 23° C. in the film quality control section 50, and the moisture included in the atmosphere in the vicinity of the substrate is made to condense into dew. Even if the moisture is made to condense into dew on the surface of the substrate, reforming of the SOG film can be carried out in the same way as in the above-described embodiments. As a result, pattern peeling-off brought about at the interface between the SOG film and the resist film is suppressed. Consequently, the resist pattern could be formed without peeling-off until the dimension of the line pattern of the 1:1 line-and-space pattern was made to be 70 nm. When a gas whose humidity is 40% which is the same as the previous case, and whose temperature is 23° C. is sprayed onto the SOG coating film, as described in FIG. 3 of the first embodiment, the limit dimension for collapse remains about 85 nm, and the effect as described in the present embodiment cannot be obtained. In a state in which the temperature of the substrate is 23° C., and when the temperature of the gas to be sprayed is 40° C. and the humidity thereof is 40%, because the surface layer of the SOG coating film comes into contact with even more water due to the moisture included in the gas being made to condense into dew, the effect on reforming the SOG film quality is further improved, and processing can be carried out in a short time. Therefore, even when the humidity is 40%, there is no resist pattern peeling-off at the interface between the resist film and the SOG film up to the resist pattern in which the line dimension of the 1:1 line-and-space pattern is made to be 70 nm, and a vertical pattern can be formed.

In this embodiment, the processing is carried out by spraying a gas whose temperature is 40° C. and whose humidity is 40% onto the SOG coating film. However, the temperature and the humidity of the gas to be sprayed, and the processing time are not limited to the processing conditions of the present embodiment, or the embodiment is not limited thereto, and any condition in which moisture included in the gas in the vicinity of the substrate can be made to condense into dew may be used. For example, as described in the third embodiment, the film quality of the SOG film can be controlled by spraying a gas whose temperature is 40° C. and whose humidity is 40% onto the SOG coating film in a state in which the substrate having the SOG coating film formed thereon is conveyed to the heat treatment section, and the substrate is held at a position sufficiently kept away from the hot plate in the heat treatment section. Therefore, any form of executing means in which the same effect can be obtained may be used. Further, the humidity in the film quality control section is not necessarily within a range in which the limit dimension for collapse of the resist pattern shows the minimum. If there is no problem in using the semiconductor device manufactured by using the present processing, the condition may be selected. Therefore, an optimum condition may be selected as a processing condition in the film quality control section in accordance with each necessity.

In this embodiment, the case of the SOG film has been described. However, a material for which the present invention is available is not limited thereto. Concretely, the present invention is available for a material classified into a well-known SOD film as well.

The chemically amplified resist having the reactivity to an ArF was used as the resist used in the present embodiment. However, it is not limited thereto, and the same effect could be obtained with respect to other alicyclic resins (acrylic, cycloolefin methyl adamantine, and hybrid resins) as well. Further, it is available for a resin having an aromatic compound as well, and the effect upon i-line and g-line resists having a novolak resin, a KrF resist composed of a resin having a polyvinyl phenolic skeleton, an electron beam exposure resist, a soft X-ray (EUV) exposure resist, or the like as well could be verified.

Fifth Embodiment

In the present embodiment, a film-forming method for a chemically amplified resist film by a semiconductor lithography process will be described. In the present embodiment, a film-forming method in a three-layer resist process will be described. In this three-layer film, suppose that an antireflection film is the lower layer film, an SOG film is the intermediate film, and a chemically amplified resist film is the upper layer film.

Hereinafter, there will be described a film-forming method for a chemically amplified resist film which is the upper layer film in a three-layer resist process and the effect when a resist pattern is formed by using this film-forming method. Concretely, the control of the film quality of the resist film is carried out by exposing the inside of the film quality control section under the atmosphere with the humidity of a given value or more after completion of coating a resist solution. After the control of the film quality, heat treatment is carried out onto the resist solution film, and a resist film is formed. Next, a method in which the roughness of the resist pattern and the uniformity of the dimensions in the substrate plane are further improved than that by the conventional method when the chemically amplified resist film is exposed and developed will be described.

FIGS. 7A to 7G are diagrams showing the procedure of a pattern forming method according to a fifth embodiment of the present invention.

First, as shown in FIG. 7A, in the same way as in the first embodiment, the antireflection film 12 is formed on the substrate 11. Next, as shown in FIG. 7B, a coating type insulating film coating material is coated onto the antireflection film 12 by a spin coating method as the intermediate film. The substrate 11 is conveyed to the heat treatment section. The substrate 11 is heated under the condition of 350° C. for 120 seconds, whereby an SOP film 68 whose film thickness is 50 nm is formed.

Next, coating processing for a chemically amplified resist film serving as the upper layer film onto the SOG film 68 will be described. Here, coating is carried out by using a spin coating method.

Here, coating is carried out by using a spin coating method. As shown in FIG. 7C, when the substrate 11 placed on a spin chuck 63 is rotated along with the spin chuck 63, a processing liquid supplying nozzle 64 is held by a movable arm, and a chemically amplified positive resist film coating material which is a processing liquid is discharged onto the substrate. Then, as shown in FIG. 7D, by rotating the substrate for a given time, a coating film 70 of the chemically amplified resist is formed.

Subsequently, as shown in FIG. 7E, the substrate 11 is conveyed to the film quality control section 50 for the chemically amplified resist. Because the film quality control section 50 is the same as that shown in FIG. 6, descriptions thereof will be omitted. Then, heat treatment is carried out with respect to the substrate 11 under the condition of 15° C. for 5 seconds under the environment that the temperature is 23° C. and the humidity is 55% in the processing container 51. At that time, moisture included in the atmosphere in the vicinity of the surface of the coating film 70 condensed into dew.

As shown in FIG. 7F, after completion of the processing in the film quality control section 50, the substrate is conveyed to the heat treatment section, and is loaded on a hot plate 71. Then, heating is carried out under the condition of 120° C. for 60 seconds to form and a chemically amplified resist film 72 whose film thickness is 150 nm.

Next, a pattern is exposed by reducing-projection via a reticle for exposure by using an ArF excimer laser. Heating processing is carried out onto the substrate under the condition of 130° C. for 60 seconds, and the substrate is conveyed to a developing apparatus. In the developing apparatus, a developer is supplied onto the substrate, and after the developing for 30 seconds, a pure water is supplied while rotating the substrate, a stop of the reaction and cleaning are carried out, and the substrate is dried by spin drying. By carrying out these processings, a 1:1 line-and-space pattern 73 in which the half pitch is 90 nm is formed (FIG. 7G).

When the dispersion in the line edge roughness of the resist pattern formed by the above-described processes was measured, $3\sigma$ was greatly reduced to 1.5 nm as compared with 4.5 nm by the conventional method. Further, with respect to the uniformity of the pattern dimensions in the substrate plane, $3\sigma$ was 3.5 nm as compared with 5 nm by the conventional method. Moreover, when 24 substrates were sequentially processed, with respect to the dispersion among the substrates, $3\sigma$ was 3 nm as compared with 4 nm by the conventional method, and the high uniformity could be obtained. As a result, the surface of the pattern with little irregularity on the entire substrate plane could be formed, and the reliability of the device could be further improved.

Figure 8:
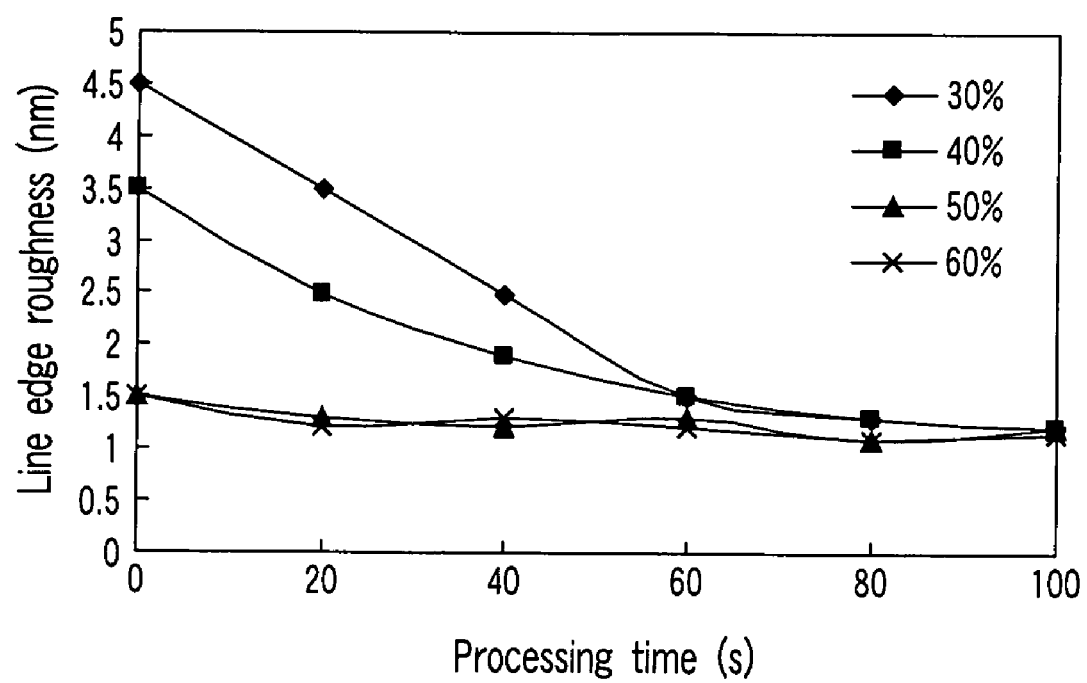
FIG. 8 is a graph showing a relationship between a processing time and a line edge roughness in the film quality control section after completing SOG film coating.

In the embodiment, the reforming processing for the chemically amplified resist was carried out under the environment that the humidity in the vicinity of the surface of the substrate is controlled to be 50% in the film quality control section. However, the humidity in the film quality control section is not limited thereto. The relationship of the line edge roughness of the formed resist pattern with respect to the processing time in the film quality control section was examined. FIG. 8 is a graph showing the relationship between the humidity in the film quality control section and a line edge roughness. As described in the embodiment described above as well, the higher the humidity in the film quality control section is, the smaller the value of the line edge roughness is. Further, it was understood that, provided that processing was carried out for 60 seconds or more, the maximum effect of the resist could be brought out in any condition. Further, there was the trend that the uniformity of the dimensions in the substrate plane was in the same way.

Because the influence of humidity onto the line edge roughness and the uniformity of the dimensions in the substrate plane differs in accordance with the types and the combinations of the chemically amplified resist and the lower layer film, it is recommended that an optimum humidity be appropriately selected as the humidity in the film quality control section. In addition, even if the value of the line edge roughness is within a range in which the minimum value is not shown, the time may be selected when there is no problem in the usage. Therefore, it is recommended that an optimum humidity be appropriately selected as the humidity in the film quality control section in accordance with the necessity such as a usage or a processing time.

Further, in the embodiment, the film quality of the chemically amplified resist film is controlled by controlling the humidity environment in the film quality control section and the processing conditions. However, means for carrying out the control of the film quality of the resist film is not limited thereto. One of the embodiments described in the first to fourth embodiments, or a form of combining those may be used, and any method by which the effects which are the same as those described in the above descriptions can be obtained during the interval from the time when the coating film of the chemically amplified resist film is formed up to the time when heat treatment is carried out may be used.

Moreover, in the embodiment, the line edge roughness of the resist pattern was carried out by determining an optimum processing conditions, on the basis of the relationship of the dependence with respect to the humidity and the processing time in the film quality control section, of the line edge roughness of the resist pattern. However, the method for obtaining a necessary resist coating film is not limited thereto. In addition thereto, at least one relationship or more is acquired from among the relationships between a value of the resist pattern and a residual solvent content included in the resist coating film, a contact angle of the resist coating film with respect to liquid, an optical constant of the resist coating film, the surface roughness of the resist coating film, and a chemical composition in the depth direction of the resist coating film; and a target resist pattern can be formed, by forming the resist coating film on the basis of the acquired relationship.

The chemically amplified resist having the reactivity to an ArF was used as the resist used in the present embodiment. However, it is not limited thereto, and the same effect could be obtained with respect to other alicyclic resins (acrylic, cycloolefin methyl adamantine, and hybrid resins) as well.

Further, it is available for a resin having an aromatic compound as well, and the effect upon i-line and g-line resists having a novolak resin, a KrF resist composed of a resin having a polyvinyl phenolic skeleton, an electron beam exposure resist, a soft X-ray (EUV) exposure resist, or the like as well could be verified.

Further, in the present embodiment, the three-layer process has been described. However, the same effect was verified in a two-layer resist process by which a chemically amplified resist film is formed on an organic antireflection film.

Note that the pattern forming methods described in the first to fifth embodiments described above can be applied to manufacturing processes for forming, for example, a liquid crystal display (LCD), in addition to the manufacturing processes for a semiconductor device. Further, those are not limited to an application for forming a coating type insulating film serving as an intermediate film of the three-layer resist process, and may be applied to the formation of a coating type interlayer insulating film of a semiconductor device. The surface layer of the coating type interlayer insulating film is made miniature, and the diffusion of the materials constituting the film formed on the upper layer, and the reaction between the film of the upper layer and the coating type interlayer insulating film can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming method comprising:
   forming a liquid coating film on a substrate by supplying a liquid containing a coating type thin film forming substance and a solvent onto the substrate;
   substantially converging a variation in film thickness of the coating film;
   making the coating film stand by in an atmosphere including moisture under a predetermined condition after the substantial-convergence, the predetermined condition being such that a product of a time for which the coating film is exposed to the atmosphere and a water content per unit volume in an atmosphere in the vicinity of a surface of the coating film is made to be greater than or equal to a predetermined value; and
   forming a solid thin film on the substrate after the stand-by, the thin film being formed by carrying out an elimination of the solvent in the coating film and heat treatment for generating an irreversible reaction to the coating type thin film forming substance in the coating film; and
   reforming a surface layer of the coating film into a miniature structure by the stand-by and the heat treatment, the surface layer being reformed by hydrolyzing the molecules of the surface layer and making the molecular content of the surface layer molecules less.

2. The film forming method according to claim 1, wherein at least one of a temperature in the vicinity of the surface of the coating film, humidity in the vicinity of the surface of the coating film, and a temperature of the substrate is controlled during the time of the stand-by.

3. The film forming method according to claim 2, wherein the temperature and the humidity in the vicinity of the surface of the coating film are set such that moisture condenses into dew on the coating film.

4. The film forming method according to claim 1, wherein a substance including moisture is made to come into contact with or approach to the surface of the coating film during the time of the stand-by.

5. The film forming method according to claim 1, wherein the thin film is an insulating film, the method further comprising: forming a resist film on the thin film; and forming a resist by exposing and developing the resist film.

6. The film forming method according to claim 5, wherein the predetermined value is determined on the basis of a dimension by which pattern collapse of the resist pattern is brought about.

7. The film forming method according to claim 6, wherein the predetermined value is 200 s×mg/L.

8. The film forming method according to claim 1, wherein the thin film is a resist film, the method further comprising: forming a resist pattern by exposing and developing the resist film.

9. The film forming method according to claim 8, wherein the predetermined value is determined on the basis of dependence on a line edge roughness of the resist pattern.

10. The method according to claim 1, wherein the coating film is provided over the entire upper surface of the substrate.

11. A method of manufacturing a semiconductor device, comprising:

forming a liquid coating film on a semiconductor wafer by supplying a liquid containing a coating type thin film forming substance and a solvent onto the semiconductor wafer;

substantially converging a variation in film thickness of the coating film;

making the coating film stand by in an atmosphere including moisture under a predetermined condition after the substantial-convergence, the predetermined condition being such that a product of a time for which the coating film is exposed to the atmosphere and a water content per unit volume in an atmosphere in the vicinity of a surface of the coating film is made to be greater than or equal to a predetermined value; and forming a solid thin film on the semiconductor wafer after the stand-by, the thin film being formed by carrying out an elimination of the solvent in the coating film and heat treatment for generating an irreversible reaction to the coating type thin film forming substance in the coating, film; and reforming a surface layer of the coating film into a miniature structure by the stand-by and the heat treatment, the surface layer being reformed by hydrolyzing the molecules of the surface layer and making the molecular content of the surface layer molecules less.

12. The method according to claim 11, wherein at least one of a temperature in the vicinity of the surface of the coating film, humidity in the vicinity of the surface of the coating film, and a temperature of the substrate is controlled during the time of the stand-by.

13. The method according to claim 12, wherein the temperature and the humidity in the vicinity of the surface of the coating film are set such that moisture condenses into dew on the coating film.

14. The method according to claim 11, wherein a substance including moisture is made to come into contact with or approach to the surface of the coating film during the time of the stand-by.

15. The method according to claim 11, wherein the thin film is an insulating film, the method further comprising: forming a resist film on the thin film; and forming a resist pattern by exposing and developing the resist film.

16. The method according to claim 15, wherein the predetermined value is determined on the basis of a dimension by which pattern collapse of the resist pattern is brought about.

17. The method according to claim 16, wherein the predetermined value is 200 s×mg/L.

18. The method according to claim 11, wherein the thin film is a resist film, the method further comprising: forming a resist pattern by exposing and developing the resist film.

19. The method according to claim 18, wherein the predetermined value is determined on the basis of dependence on a line edge roughness of the resist pattern.

20. The method according to claim 11, wherein the coating film is provided over the entire upper surface of the semiconductor wafer.

* * * * *

UNITED STATES PATENT AND TRADEMARK OFFICE
CERTIFICATE OF CORRECTION

PATENT NO. : 7,709,383 B2
APPLICATION NO. : 11/034926
DATED : May 4, 2010
INVENTOR(S) : Kato et al.

It is certified that error appears in the above-identified patent and that said Letters Patent is hereby corrected as shown below:

Claim 11, column 16, line 3, change "coating," to --coating--.

Signed and Sealed this

Thirteenth Day of July, 2010

David J. Kappos
*Director of the United States Patent and Trademark Office*